United States Patent
Kim et al.

(10) Patent No.: US 9,929,221 B2
(45) Date of Patent: Mar. 27, 2018

(54) ORGANIC LIGHT EMITTING DIODE DISPLAY DEVICE

(71) Applicant: LG Display Co., Ltd., Seoul (KR)

(72) Inventors: Kang-Hyun Kim, Seoul (KR); Ki-Soub Yang, Paju-si (KR); Seung-Ryul Choi, Goyang-si (KR); Kyoung-Jin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/198,808

(22) Filed: Jun. 30, 2016

(65) Prior Publication Data

US 2017/0005151 A1  Jan. 5, 2017

(30) Foreign Application Priority Data

Jun. 30, 2015  (KR) .................. 10-2015-0093650

(51) Int. Cl.
  *H01L 29/06* (2006.01)
  *H01J 1/62* (2006.01)
  *G02F 1/1343* (2006.01)
  *H01L 27/32* (2006.01)

(52) U.S. Cl.
  CPC ...... *H01L 27/3246* (2013.01); *H01L 27/3218* (2013.01); *H01L 27/3276* (2013.01)

(58) Field of Classification Search
  CPC .............. H01L 27/3246; H01L 27/3218; H01L 27/3276; H05B 33/00
  USPC ........ 257/40; 313/504, 498; 349/143; 430/5, 430/322
  See application file for complete search history.

(56) References Cited

U.S. PATENT DOCUMENTS

| 8,203,261 | B2 | 6/2012 | Tanaka et al. | |
| 2005/0118328 | A1* | 6/2005 | Seki | H01L 51/0005 427/66 |
| 2008/0084376 | A1* | 4/2008 | Hirota | G09G 3/3607 345/88 |
| 2009/0051640 | A1* | 2/2009 | Tanaka | G02F 1/136286 345/92 |
| 2012/0074834 | A1* | 3/2012 | Kanegae | H01L 27/3276 313/498 |
| 2014/0147950 | A1* | 5/2014 | Choi | H01L 51/0005 438/46 |

(Continued)

FOREIGN PATENT DOCUMENTS

| TW | 201431050 A | 8/2014 |
| TW | 201448197 A | 12/2014 |

*Primary Examiner* — Dzung Tran
(74) *Attorney, Agent, or Firm* — Dentons US LLP

(57) ABSTRACT

An organic light emitting diode display device (100) including: a plurality of pixels (101, 102, 103) each including first (101a, 102a, 103a), second (101b, 102b, 103b) and third sub-pixels (101c, 102c, 103c), wherein the first sub-pixels (101a, 102a, 103a) of adjacent pixels (101, 102, 103), the second sub-pixels (101b, 102b, 103b) of adjacent pixels (101, 102, 103) and the third sub-pixels (101c, 102c, 103c) of adjacent pixels (101, 102, 103) constitute a plurality of sub-pixel groups (150); a first bank layer (171) dividing the plurality of sub-pixel groups (150) and dividing the first (101a, 102a, 103a), second (101b, 102b, 103b) and third sub-pixels (101c, 102c, 103c); and a second bank layer (173) on the first bank layer (171), the second bank layer (173) dividing the first (101a, 102a, 103a), second (101b, 102b, 103b) and third sub-pixels (101c, 102c, 103c).

15 Claims, 7 Drawing Sheets

(56) References Cited

U.S. PATENT DOCUMENTS

2015/0001486 A1* 1/2015 Kim .................... H01L 27/3246
                                                      257/40
2015/0090988 A1* 4/2015 Oooka ................ H01L 51/5228
                                                      257/40

* cited by examiner

ORGANIC LIGHT EMITTING DIODE DISPLAY DEVICE

CROSS-REFERENCE TO RELATED APPLICATIONS

This application claims the benefit of Korean Patent Application No. 10-2015-0093650, filed on Jun. 30, 2015, in the Korean Intellectual Property Office, which is incorporated herein by reference in its entirety.

BACKGROUND

1. Technical Field

The present disclosure relates to an organic light emitting diode display device, and more particularly, to an organic light emitting diode display device where degradation in display quality due to a color-mixed emitting layer through a soluble process is prevented and a high resolution is obtained.

2. Discussion of the Related Art

Recently, various flat panel displays (FPDs) such as liquid crystal display (LCD) devices, plasma display panel (PDP) devices, organic light emitting diode (OLED) display devices and field emission display (FED) devices have been widely researched and used.

Among various FPDs, since the OLED display device of an emissive device does not require an additional light source such as a backlight unit for the LCD device, the OLED display device has a light weight and a thin profile. As compared with the LCD device, the OLED display device has superior properties in a viewing angle, a contrast ratio and a power consumption. The OLED display device is driven by a direct current (DC) low voltage and has a high response speed. Since an internal element of the OLED display device is a solid, the OLED display device is resistive to an external impact and has a wide available temperature range. Specifically, since a fabrication process for the OLED display device is simple, a production cost for the OLED display device is reduced as compared with the LCD device.

FIG. 1 is a plan view showing a pixel of an organic light emitting diode display device according to a related art.

In FIG. 1, a pixel 10 of an organic light emitting diode (OLED) display device according to the related art includes first to third sub-pixels 11a to 11c sequentially arranged along a row direction. The first to third sub-pixels 11a to 11c display red, green and blue colors, respectively, and constitute a pixel. The pixel is divided into the first to third sub-pixels 11a to 11c by a bank layer 73.

FIGS. 2A and 2B are cross-sectional views, which are taken along a line II-II of FIG. 1, illustrating a process of laminating an emitting layer in each sub-pixel.

In FIG. 2A, a bank layer 73 is formed on a substrate 11. The bank layer 73 includes openings to divide first to third sub-pixels 11a to 11c (of FIG. 1). A red emitting material solution 12a is dropped in the opening of the bank layer 73 corresponding to the first sub-pixel 11a, and a green emitting material solution 12b is dropped in the opening of the bank layer 73 corresponding to the second sub-pixel 11b. Although not shown, a blue emitting material solution is dropped in the opening of the bank layer 73 corresponding to the third sub-pixel 11c.

In FIG. 2B, a drying step is performed for the red emitting material solution 12a, the green emitting material solution 12b and the blue emitting material solution to form an emitting layer in the openings of the bank layer 73. The emitting layer includes a red emitting layer 13a displaying a red color, a green emitting layer 13b displaying a green color and a blue emitting layer (not shown) displaying a blue color, and the red, green and blue emitting layers 13a and 13b are disposed in the first to third sub-pixels 11a to 11c (of FIG. 1), respectively. The red emitting layer 13a is formed in the opening corresponding to the first sub-pixel 11a, the green emitting layer 13b is formed in the opening corresponding to the second sub-pixel 11b, and the blue emitting layer is formed in the opening corresponding to the third sub-pixel 11c. The red, green and blue emitting layers 13a and 13b are formed through a soluble process such as an inkjet printing method and a nozzle printing method.

Since the bank layer 73 confines the red, green and blue emitting material solutions 12a and 12b having a water solubility, the bank layer 73 may be formed of a hydrophobic material or a top surface of the bank layer 73 may have a hydrophobicity through a surface treatment.

A pile up phenomenon where edge portions of the red, green and blue emitting layers 13a and 13b are piled up on a sidewall of the bank layer 73 may occur during the drying step. As a result, uniformity in thickness of the red, green and blue emitting layers 13a and 13b is deteriorated in each of the first to third sub-pixels 11a to 11c.

The bank layer 73 between the first to third sub-pixels 11a to 11c functions as a separator preventing a mixing of the red, green and blue emitting material solutions 12a and 12b. Accordingly, the bank layer 73 has a horizontal bank width BW equal to or greater than about 16 μm.

Further, for dropping the red emitting material solution 12a, the green emitting material solution and the blue emitting material solution in the opening of the bank layer 73 through a soluble process, each of the first to third sub-pixels 11a to 11c is required to have a width equal to or greater than a minimum dropping width.

Recently, an OLED display device having a high resolution has been widely researched. For obtaining the OLED display device of a high resolution, a number of pixels per unit area of a display region should increase and a bank width of a bank layer dividing sub-pixels should decrease. When the bank layer is formed to have the bank width smaller than about 16 μm for the OLED display device of a high resolution, the red, green and blue emitting material solutions 12a and 12b may be mixed during the dropping step, and a mixed emitting layers may be formed in each of the first to third sub-pixels 11a to 11c after the drying step. As a result, a display quality of the OLED display device may be reduced due to the mixed emitting layers.

Further, since each of the first to third sub-pixels 11a to 11c has a width equal to or greater than a minimum dropping width, reduction in a size of each sub-pixel is limited and increase in a number of pixels per unit area is limited.

SUMMARY

Embodiments of the present disclosure relate to an organic light emitting diode display device that substantially obviates one or more of the problems due to limitations and disadvantages of the related art.

One embodiment is an organic light emitting diode display device where degradation in display quality due to a color-mixed emitting layer through a soluble process is prevented and a high resolution is obtained.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one embodiment is an organic light emitting diode display device including: a plurality of pixels each including first, second and third sub-pixels, wherein the first sub-pixels of adjacent pixels, the second sub-pixels of adjacent pixels and the third sub-pixels of adjacent pixels constitute a plurality of sub-pixel groups; a first bank layer dividing the plurality of sub-pixel groups and dividing the first, second and third sub-pixels; and a second bank layer on the first bank layer, the second bank layer dividing the first, second and third sub-pixels.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
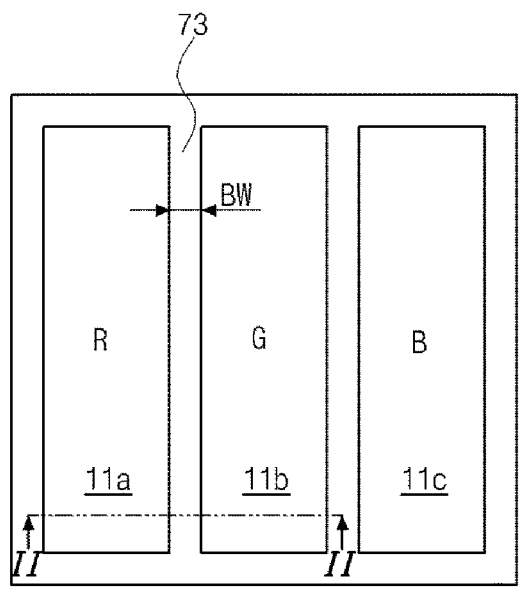
FIG. 1 is a plan view showing a pixel of an organic light emitting diode display device according to a related art.
Figure 2A:
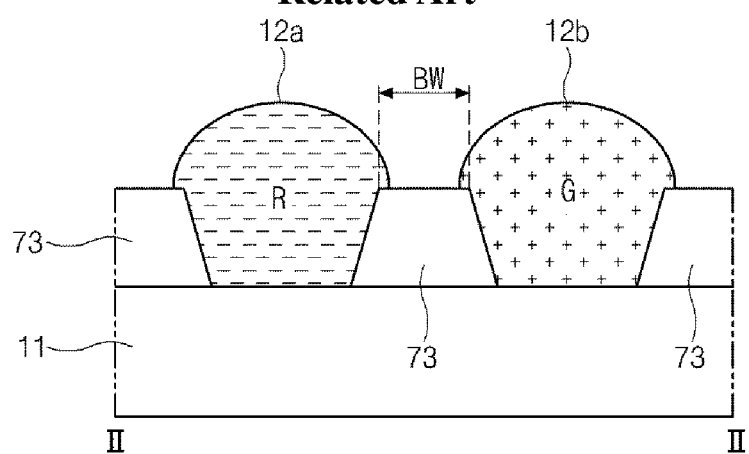
FIGS. 2A and 2B are cross-sectional views, which are taken along a line II-II of FIG. 1, illustrating a process of laminating an emitting layer in each sub-pixel.
Figure 2B:
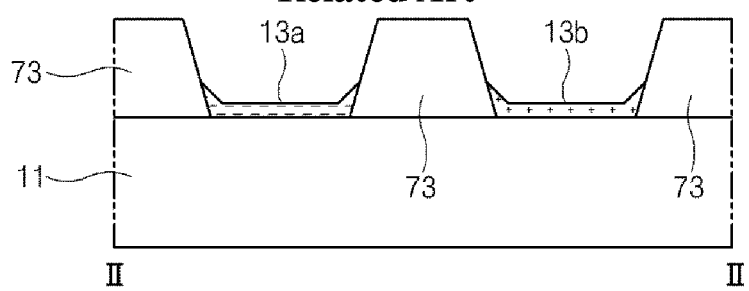

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Illustratively, various aspects of this disclosure may provide an OLED device, in which sub-pixels of the same color are grouped into one sub-group at the edge between a plurality of adjacent pixels. The sub-pixels of the same color may be arranged at a very little distance from each other, since an "overflow" from one sub-pixel to another sub-pixel of the same sub-pixel group does not do any harm since they are of the same color. Furthermore, the sub-pixels of different colors (and thus of a different sub-pixel group) may be arranged in the same pixel, but at a larger distance from each other than the sub-pixels within the same sub-pixel group. Therefore, each pixel illustratively may include a plurality of (e.g. three or four) sub-pixel groups, but from each sub-pixel group only (exactly) one sub-pixel.

Figure 3:
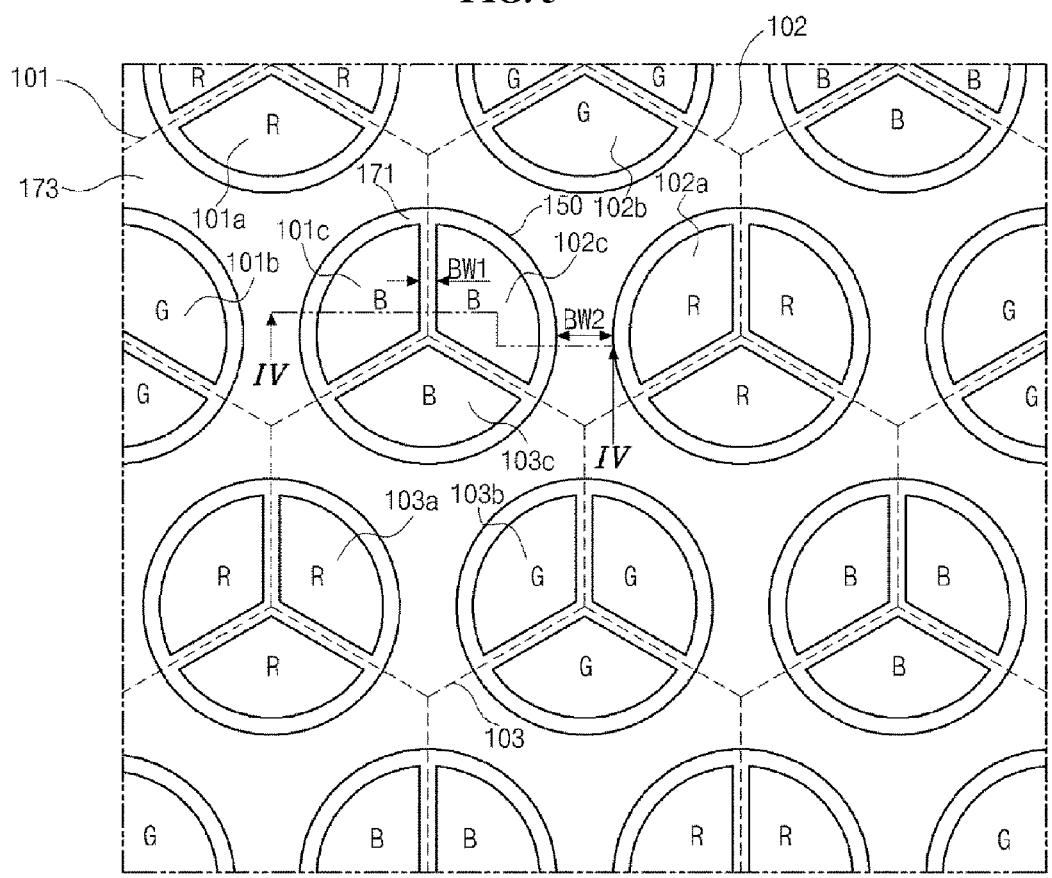
FIG. 3 is a plan view showing an organic light emitting diode display device according to an embodiment of the present disclosure.

FIG. 3 is a plan view showing an organic light emitting diode display device according to an embodiment of the present disclosure.

In FIG. 3, an organic light emitting diode (OLED) display device 100 includes a plurality of pixels 101 to 103 each having a hexagonal shape and including a first sub-pixel 101a, 102a and 103a, a second sub-pixel 101b, 102b, 103b and a third sub-pixel 101c, 102c and 103c. The plurality of first sub-pixels 101a, 102a and 103a, the plurality of second sub-pixels 101b, 102b and 103b and the plurality of third sub-pixels 101c, 102c and 103c are disposed at vertexes, which are not adjacent to and are separated from each other, of the hexagonal shape. The plurality of pixels 101 to 103 may constitute a honeycomb shape, and the three third sub-pixels 101c, 102c and 103c of the adjacent three pixels 101, 102 and 103 may be defined as a sub-pixel group 150. Thus, illustratively, each sub-pixel group may be formed of a plurality of (e.g. three) sub-pixels of the same color, wherein each sub-pixel corresponds to (in other words is assigned to) a different pixel.

In addition, the OLED display device 100 includes first and second bank layers 171 and 173. The adjacent sub-pixel groups 150 are divided, in other words are separated from each other, by the first bank layer 171. Furthermore, the adjacent first, second and third sub-pixels 101c, 102c and 103c of each of the sub-pixel group 150 are divided by the first bank layer 171. The adjacent sub-pixel groups 150 are further divided by the second bank layer 173. As a result, the first and second bank layers 171 and 173 may include a plurality of openings for dividing the plurality of sub-pixel groups 150.

For example, the plurality of first sub-pixels 101a, 102a and 103a, the plurality of second sub-pixels 101b, 102b and 103b and the plurality of third sub-pixels 101c, 102c and 103c may be disposed at three separated vertexes of the hexagonal shape of each of the plurality of pixels 101 to 103, and each of the plurality of sub-pixel groups 150 may include the adjacent three third sub-pixels 101c, 102c and 103c. By way of example, the sub-pixel groups 150 may be arranged on the vertexes such that there is always one vertex free from a sub-pixel group 150 between each vertex with a sub-pixel group 150 arranged on the vertex.

In addition, the plurality of first sub-pixels 101a, 102a and 103a, the plurality of second sub-pixels 101b, 102b and 103b and the plurality of third sub-pixels 101c, 102c and 103c of the plurality of pixels 101 to 103 may display different colors, for example, red (R), green (G) and blue (B) colors, and the adjacent three third sub-pixels 101c, 102c and 103c of each of the plurality of sub-pixel groups 150 may display the same color.

Although the adjacent three third sub-pixels 101c, 102c and 103c of the sub-pixel group 150 display the blue (B) color, the adjacent three first sub-pixels may display the red (R) color, and the adjacent three second sub-pixels may display the green (G) color.

Each of the plurality of sub-pixel groups 150 may have a circular shape or a polygonal shape having sides more than 2. The sub-pixel group 150 having a circular shape may have an advantage in thickness uniformity as compared with the sub-pixel group 150 having a polygonal shape. When the sub-pixel group 150 has a circular shape, diffusivity of a solution for an emitting layer increases and thickness uniformity of an emitting layer is improved.

When the sub-pixel group 150 has a circular shape, openings of the first and second bank layers 171 and 173 may have a circular shape. The first bank layer 171 may divide the adjacent three third sub-pixels 101c, 102c and 103c of the sub-pixel group 150 with respect to a center of the circular shape of the sub-pixel group 150, and the adjacent three third sub-pixels 101c, 102c and 103c of the sub-pixel group 150 may have the same area. In addition, the second bank layer 173 is formed on the first bank layer 171 such that edge portions of the first bank layer 171 is exposed through the opening of the second bank layer 173.

Figure 4A:
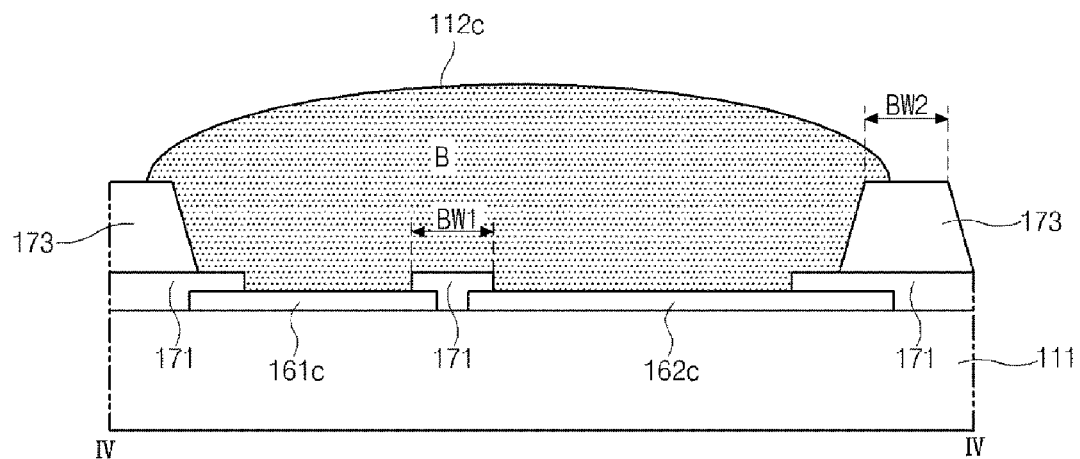
FIGS. 4A and 4B are cross-sectional views, which are taken along a line IV-IV of FIG. 3, illustrating a process of laminating an emitting layer in each sub-pixel.
Figure 4B:
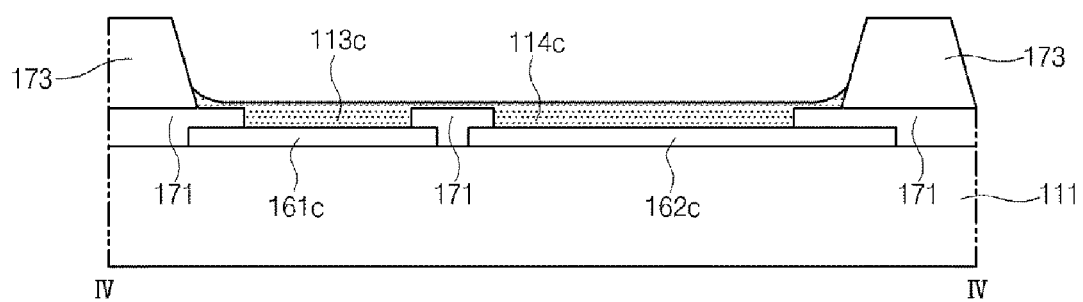

FIGS. 4A and 4B are cross-sectional views, which are taken along a line IV-IV of FIG. 3, illustrating a process of laminating an emitting layer in each sub-pixel.

In FIG. 4A, anodes 161c and 162 are formed in adjacent three third sub-pixels 101c, 102c and 103c (of FIG. 3) of each of a plurality of sub-pixel groups 150 (of FIG. 3) on a substrate 111. A first bank layer 171 is formed on the anodes such that a central portion of each anode 161c and 162c is exposed through a plurality of openings of the first bank layer 171. The anodes 161 and 162 are arranged below each sub-pixel to drive the respective sub-pixel with a corresponding driving voltage. In order to control each sub-pixel of the sub-pixels of each sub-pixel group individually, the anodes 161 and 162 from the sub-pixels of each sub-pixel are electrically isolated from each other, e.g. by means of the first bank layer 171. Moreover, the anodes 161 and 162 may be connected to a driving circuit (not shown) providing the respective driving voltages for each sub-pixel.

A second bank layer 173 is formed on the first bank layer 171 such that edge portions of the first bank layer 171 is exposed through a plurality of openings of the second bank layer 173. The first bank layer 171 divides the plurality of sub-pixel groups 150 and the plurality of third sub-pixels 101c, 102c and 103c of each sub-pixel group, and the second bank layer 173 divides the plurality of sub-pixel groups 150.

The first bank layer 171 has the plurality of openings corresponding to the adjacent three third sub-pixels 101c, 102c and 103c (of FIG. 3) of each sub-pixel group 150, and the second bank layer 173 has the plurality of openings corresponding to the plurality of sub-pixel groups 150. The first bank layer 171 has a first horizontal bank width BW1 among (between) the adjacent three third sub-pixels 101c, 102c and 103c of each sub-pixel group 150, and the second bank layer 173 has a second horizontal bank width BW2 among (between) the plurality of sub-pixel groups 150.

Next, a blue emitting material solution 112c is dropped in the opening of the first and second bank layers 171 and 173 through an inkjet printing method and a nozzle printing method. Although not shown, a red emitting material solution and a green emitting material solution may be dropped in the opening of the first and second bank layers 171 and 173.

In FIG. 4B, a drying step is performed for the blue emitting material solution 112c to form adjacent three blue emitting layers 113c and 114c in the openings corresponding to adjacent three third sub-pixels 101c, 102c and 103c (of FIG. 3) at the same time. Although not shown, a drying step may be performed for the red emitting material solution and the green emitting material solution to form adjacent three red emitting layers and adjacent three green emitting layers. The red, green and blue emitting layers constitute an emitting layer formed through a soluble process such as an inkjet printing method and a nozzle printing method.

Since the adjacent three third sub-pixels 101c, 102c and 103c display the same color, the blue emitting material solution 112c may be dropped for the adjacent three third sub-pixels 101c, 102c and 103c without discrimination of sub-pixels. As a result, the adjacent three blue emitting layers 113c and 114c in the sub-pixel group 150 are formed to be connected to each other.

The adjacent three blue emitting layers 113c and 114c constitute a sub-pixel group 150 (of FIG. 3). Although not shown, the adjacent three red emitting layers constitute a sub-pixel group 150 and the adjacent three green emitting layers constitute a sub-pixel group 150. Accordingly, the emitting layer of each sub-pixel group 150 may display one of red, green and blue colors.

In the OLED display device 100, since the adjacent three blue emitting layers 113c and 114c display the same blue color, a mixing of the blue emitting material solution 112c in the adjacent three third sub-pixels 101c, 102c and 103c of each sub-pixel group 150 does not cause deterioration of display quality.

In addition, a mixing of the red emitting material solution, the green emitting material solution and the blue emitting material solution 112c is prevented regardless of the first bank width BW1 of the first bank layer 171 dividing the adjacent three third sub-pixels 101c, 102c and 103c of each sub-pixel group 150. Since it is not required that the first bank layer 171 divides the red emitting material solution, the green emitting material solution or the blue emitting material solution 112c in each sub-pixel group 150, the first bank layer 171 may have the first bank width BW1 equal to or smaller than about 16 μm. For example, the first bank layer 171 may have the first bank width BW1 of about 5 μm.

Further, since a color-mixed emitting layer is not formed in the first, second and third sub-pixels 101a to 101c, 102a to 102c and 103a to 103c of each pixel 101, 102 and 103, deterioration in display quality is prevented.

Moreover, since each sub-pixel group 150 is required to have equal to or greater than a minimum dropping width for a soluble process, a width of each of the first, second and third sub-pixels 101a to 101c, 102a to 102c and 103a to 103c can be reduced as compared with the related art OLED display device 10 (of FIG. 1). As a result, a size of each sub-pixel can decrease and a number of pixels per unit area can increase to obtain an OLED display device of a high resolution.

The second bank layer 173 dividing the plurality of sub-pixel groups 150 has the to prevent a mixing of the red emitting material solution, the green emitting material solution or the blue emitting material solution 112c between the adjacent sub-pixel groups 150. The second bank layer 173 may have a minimum horizontal second bank width BW2 between respective two adjacent openings in the second bank layer 173 which is greater than the horizontal first bank width BW1. For example, the second bank layer 173 may have the second bank width BW2 of greater than about 16 μm, for example in the range from about 16 μm to about 25 μm.

The first bank layer 171 may be formed of a hydrophilic material and the second bank layer 173 may be formed of a hydrophobic material. For example, the first bank layer 171 may include an inorganic material such as silicon oxide ($SiO_2$) an silicon nitride (SiNx), and the second bank layer 173 may include an organic material such as polyacryl, polyimide, polyamide (PA), benzocyclobutene (BCB) and phenol resin.

When the second bank layer 173 is formed of a hydrophobic material, the second bank layer 173 may confine the red emitting material solution, the green emitting material solution or the blue emitting material solution 112c having a water solubility in the opening corresponding to each sub-pixel group 150.

Alternatively, the second bank layer 173 may be formed of a hydrophilic material and a surface of the second bank layer 173 of a hydrophilic material may have a hydrophobicity through a surface treatment using a fluorine (F).

The first bank layer 171 is formed of a hydrophilic material, edge portions of the first bank layer 171 exposed through the opening of the second bank layer 173 may hold movement of molecules in the red emitting material solution, the green emitting material solution or the blue emitting material solution 112c. As a result, a pile up phenomenon where edge portions of the red, green and blue emitting layers 113c and 114c in the adjacent three third sub-pixels 101c, 102c and 103c of each sub-pixel group 150 are piled up on a sidewall of the second bank layer 173 during the drying step may be alleviated.

In addition, since a pile up phenomenon is prevented at a sidewall of the first bank layer 171 dividing the adjacent three third sub-pixels 101c, 102c and 103c of each sub-pixel group 150, uniformity in thickness of the emitting layer is improved.

Figure 5:
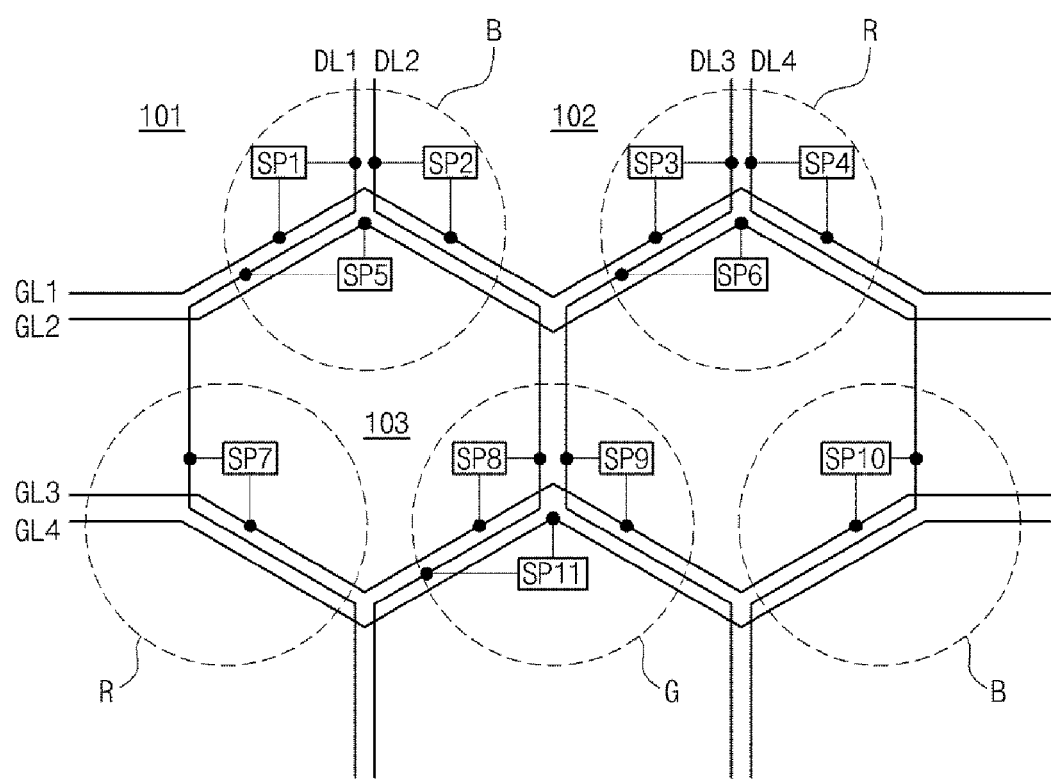
FIG. 5 is a view showing conductive lines of an organic light emitting diode display device according to an embodiment of the present disclosure.

FIG. 5 is a view showing conductive lines of an organic light emitting diode display device of FIG. 3.

In FIG. 5, an organic light emitting diode (OLED) display device 100 (of FIG. 3) includes first to fourth gate lines GL1 to GL4, first to fourth data lines DL1 to DL4 crossing the first to fourth gate lines GL1 to GL4 and first to tenth sub-pixels SP1 to SP11 at crossing of the first to fourth gate lines GL1 to GL34 and the first to fourth data lines DL1 to DL4.

The first sub-pixel SP1 is connected to the first gate line GL1 and the first data line DL1, the second sub-pixel SP2 is connected to the first gate line GL1 and the second data line DL2, the third sub-pixel SP3 is connected to the first gate line GL1 and the third data line DL3, and the fourth sub-pixel SP4 is connected to the first gate line GL1 and the fourth data line DL4.

The fifth sub-pixel SP5 is connected to the second gate line GL2 and the first data line DL1, and the sixth sub-pixel SP6 is connected to the second gate line GL2 and the third data line DL3.

In another embodiment, the fifth sub-pixel SP5 may be connected to the second gate line GL2 and the second data line DL2, and the sixth sub-pixel SP6 may be connected to the second gate line GL2 and the fourth data line DL4.

The seventh sub-pixel SP7 is connected to the third gate line GL3 and the first data line DL1, the eighth sub-pixel SP8 is connected to the third gate line GL3 and the second data line DL2, the ninth sub-pixel SP9 is connected to the third gate line GL3 and the third data line DL3, and the tenth sub-pixel SP10 is connected to the third gate line GL3 and the fourth data line DL4.

The eleventh sub-pixel SP11 is connected to the fourth gate line GL4 and the second data line DL2. In another embodiment, the eleventh sub-pixel SP11 may be connected to the fourth gate line GL4 and the third data line DL3.

The first, second and fifth sub-pixels SP1, SP2 and SP5 constitute a sub-pixel group 150 (of FIG. 3), and the third, fourth and sixth sub-pixel SP4, SP5 and SP6 constitute another sub-pixel group 150. For forming an emitting layer in the first, second and fifth sub-pixels SP1, SP2 and SP5 of a sub-pixel group 150 and forming another emitting layer in the third, fourth and sixth sub-pixel SP4, SP5 and SP6 of another sub-pixel group 150, the first, second and fifth sub-pixels SP1, SP2 and SP5 are disposed with a relatively short distance and the third, fourth and sixth sub-pixel SP4, SP5 and SP6 are disposed with a relatively short distance.

As a result, the first to fourth gate lines GL1 to GL4 and the first to fourth data lines DL1 to DL4 are disposed along sides of a hexagonal shape of each pixel 101 to 103 (of FIG. 3) to have a zigzag shape. For example, the first to fourth gate lines GL1 to GL4 may be bent with an angle of about 120° to have a zigzag shape including a straight line and a triangular protrusion, and the first to fourth data lines DL1 to DL4 may be bent with an angle of about 120° to have a zigzag shape including a straight line and a trapezoidal protrusion.

Consequently, in the OLED display device 100 according to an embodiment of the present disclosure, a color-mixed emitting layer through a soluble process is prevented, display quality is improved. In addition, since a horizontal bank width of a bank layer dividing sub-pixels is reduced and a number of pixels per unit area increases, a high resolution is obtained. Further, since first and second bank layer include a hydrophobic material and a hydrophilic material, respectively, thickness uniformity of an emitting layer is improved.

Figure 6:
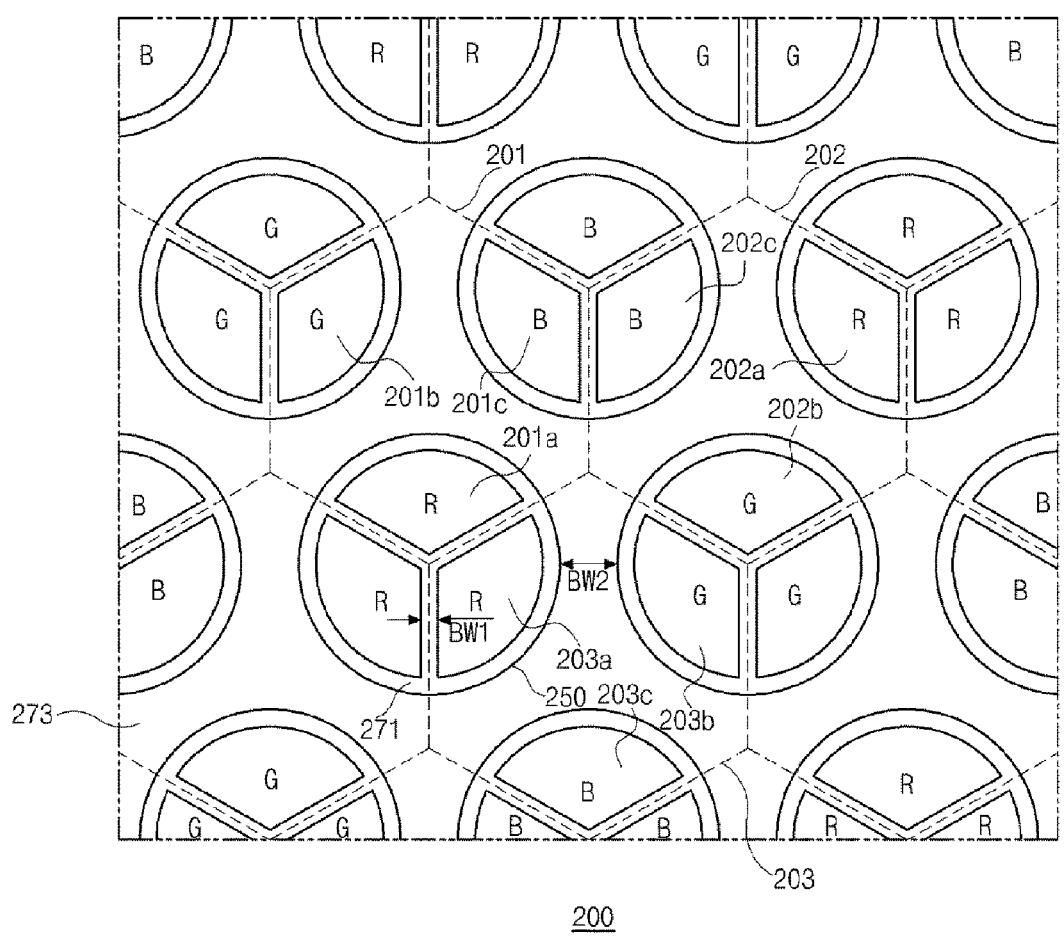
FIG. 6 is a cross-sectional view, which is taken along a line IV-IV of FIG. 3, illustrating the structure of the emitting layer in each sub-pixel in more detail.

FIG. 6 is a plan view showing an organic light emitting diode display device according to another embodiment of the present disclosure.

In FIG. 6, an organic light emitting diode (OLED) display device 200 includes a plurality of pixels 201 to 203 each having a hexagonal shape and including a first sub-pixel 201a, 202a and 203a, a second sub-pixel 201b, 202b, 203b and a third sub-pixel 201c, 202c and 203c. The plurality of first sub-pixels 201a, 202a and 203a, the plurality of second sub-pixels 201b, 202b and 203b and the plurality of third sub-pixels 201c, 202c and 203c are disposed at vertexes, which are not adjacent to and are separated from each other, of the hexagonal shape. The plurality of pixels 201 to 203 may constitute a honeycomb shape, and the three third sub-pixels 201c, 202c and 203c of the adjacent three pixels 201, 202 and 203 may be defined as a sub-pixel group 250. Thus, illustratively, each sub-pixel group may be formed of a plurality of (e.g. three) sub-pixels of the same color, wherein each sub-pixel corresponds to (in other words is assigned to) a different pixel.

In addition, the OLED display device 200 includes first and second bank layers 271 and 273. The adjacent sub-pixel groups 250 are divided, in other words are separated from each other, by the first bank layer 271. Furthermore, the adjacent first, second and third sub-pixels 201c, 202c and 203c of each of the sub-pixel group 250 are divided by the first bank layer 271. The adjacent sub-pixel groups 250 are further divided by the second bank layer 273. As a result, the first and second bank layers 271 and 273 may include a plurality of openings for dividing the plurality of sub-pixel groups 250.

For example, the plurality of first sub-pixels 201a, 202a and 203a, the plurality of second sub-pixels 201b, 202b and 203b and the plurality of third sub-pixels 201c, 202c and 203c may be disposed at three separated vertexes of the hexagonal shape of each of the plurality of pixels 201 to 203, and each of the plurality of sub-pixel groups 250 may include the adjacent three third sub-pixels 201c, 202c and 203c. By way of example, the sub-pixel groups 250 may be arranged on the vertexes such that there is always one vertex free from a sub-pixel group 250 between each vertex with a sub-pixel group 250 arranged on the vertex.

In addition, the plurality of first sub-pixels 201a, 202a and 203a, the plurality of second sub-pixels 201b, 202b and 203b and the plurality of third sub-pixels 201c, 202c and 203c of the plurality of pixels 201 to 203 may display different colors, for example, red (R), green (G) and blue (B) colors, and the adjacent three third sub-pixels 201c, 202c and 203c of each of the plurality of sub-pixel groups 250 may display the same color.

Although the adjacent three third sub-pixels 201c, 202c and 203c of the sub-pixel group 250 display the blue (B) color, the adjacent three first sub-pixels may display the red (R) color, and the adjacent three second sub-pixels may display the green (G) color.

Each of the plurality of sub-pixel groups 250 may have a circular shape or a polygonal shape having sides more than 2. The sub-pixel group 250 having a circular shape may have an advantage in thickness uniformity as compared with the sub-pixel group 250 having a polygonal shape. When the sub-pixel group 250 has a circular shape, diffusivity of a solution for an emitting layer increases and thickness uniformity of an emitting layer is improved.

When the sub-pixel group 250 has a circular shape, openings of the first and second bank layers 271 and 273 may have a circular shape. The first bank layer 271 may divide the adjacent three third sub-pixels 201c, 202c and 203c of the sub-pixel group 250 with respect to a center of the circular shape of the sub-pixel group 250, and the adjacent three third sub-pixels 201c, 202c and 203c of the sub-pixel group 250 may have the same area. In addition, the second bank layer 273 is formed on the first bank layer 271 such that edge portions of the first bank layer 271 is exposed through the opening of the second bank layer 273.

Figure 7:
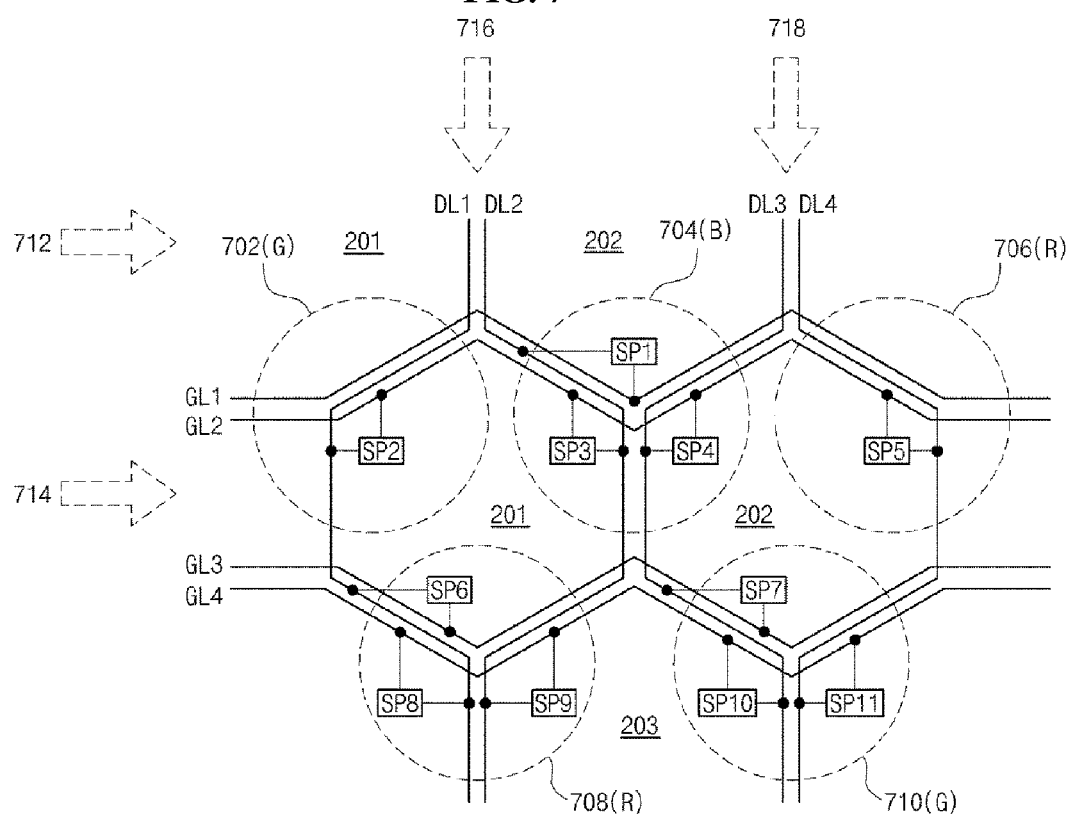
FIG. 7 is a view showing the structure of FIG. 5 in more detail.

FIG. 7 is a view showing conductive lines of an organic light emitting diode display device of FIG. 6.

As shown in FIG. 7, the connection structure of electrically connecting the sub-pixels with the data driver circuit and the gate driver circuit, respectively, is as follows:

In summary, the sub-pixels of each pixel are respectively driven by (exactly) two gate lines and (exactly) two data lines running through the respective pixels.

In more detail, a first gate line GL1 may be connected to the gate of a field effect transistor (FET) of a first sub-pixel SP1 of a second sub-pixel group (e.g. providing blue color) 704. Illustratively, the first gate line GL1 extends approximately horizontally in a sawtooth fashion along the lower portions of the pixel vertices of a first pixel line 712.

A second gate line GL2 may be connected to the gate of a FET of a second sub-pixel SP2 of a first sub-pixel group (e.g. providing green color) 702, to the gate of a FET of a third sub-pixel SP3 of the second sub-pixel group (e.g. providing blue color) 704, to the gate of a FET of a fourth sub-pixel SP4 of the second sub-pixel group (e.g. providing blue color) 704, and to the gate of a FET of a fifth sub-pixel SP5 of a third sub-pixel group (e.g. providing red color) 706. Illustratively, the second gate line GL2 extends approximately horizontally in a sawtooth fashion along the upper portions of the pixel vertices of a second pixel line 714.

Furthermore, a third gate line GL3 may be connected to the gate of a FET of a sixth sub-pixel SP6 of a fourth sub-pixel group (e.g. providing red color) 708, to the gate of a FET of a seventh sub-pixel SP7 of a fifth sub-pixel group (e.g. providing green color) 710. Illustratively, the third gate line GL3 extends approximately horizontally in a sawtooth fashion along the lower portions of the pixel vertices of the second pixel line 714.

Moreover, a fourth gate line GL4 may be connected to the gate of a FET of a eighth sub-pixel SP8 of the fourth sub-pixel group (e.g. providing red color) 708, to the gate of a FET of a ninth sub-pixel SP9 of the fourth sub-pixel group 708. The fourth gate line GL4 may further be connected to the gate of a FET of a tenth sub-pixel SP10 of the fifth sub-pixel group (e.g. providing green color) 710 and to the gate of a FET of a eleventh sub-pixel SP11 of the fifth sub-pixel group 710. Illustratively, the fourth gate line GL4 extends approximately horizontally in a sawtooth fashion along the upper portions of the pixel vertices of a third pixel line.

Further, a first data line DL1 may be connected to the source of the FET of the second sub-pixel SP2 of the first sub-pixel group (e.g. providing green color) 702, to the source of the FET of the sixth sub-pixel SP6 of the fourth sub-pixel group (e.g. providing red color) 708, and to the source of the FET of the eighth sub-pixel SP8 of the fourth sub-pixel group 708. Illustratively, the first data line DL1 extends approximately vertically in a sawtooth fashion along the left hand portions of the pixel vertices of a first pixel column 716.

Further, a second data line DL2 may be connected to the source of the FET of the first sub-pixel SP1 of the second sub-pixel group (e.g. providing blue color) 704, to the source of the FET of the third sub-pixel SP3 of the second sub-pixel group (e.g. providing blue color) 704, and to the source of the FET of the ninth sub-pixel SP9 of the fourth sub-pixel group (e.g. providing red color) 708. Illustratively, the second data line DL2 extends approximately vertically in a sawtooth fashion along the right hand portions of the pixel vertices of the first pixel column 716.

Further, a third data line DL3 may be connected to the source of the FET of the fourth sub-pixel SP4 of the second sub-pixel group (e.g. providing blue color) 704, to the source of the FET of the seventh sub-pixel SP7 of the fifth sub-pixel group (e.g. providing green color) 710, and to the source of the FET of the tenth sub-pixel SP10 of the fifth sub-pixel group 710. Illustratively, the third data line DL3 extends approximately vertically in a sawtooth fashion along the left hand portions of the pixel vertices of a second pixel column 718.

Further, a fourth data line DL4 may be connected to the source of the FET of the fifth sub-pixel SP5 of the third sub-pixel group (e.g. providing red color) 706, and to the source of the FET of the eleventh sub-pixel SP11 of the fifth sub-pixel group (e.g. providing green color) 710. Illustratively, the fourth data line DL4 extends approximately vertically in a sawtooth fashion along the right hand portions of the pixel vertices of the second pixel column 718.

Thus, the connection structure may form a so-called DRD connection structure of the sub-pixels and the pixels of the OLED device. In other words, in the DRD connection structure, each pixel is connected to (and is thus driven by) respective two gate lines and two data lines.

Furthermore, it is to be noted that the FETs may be implemented as thin film transistors (TFT).

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An organic light emitting diode display device, comprising:
   a plurality of pixels each including first, second and third sub-pixels, wherein the first sub-pixels of adjacent pixels, the second sub-pixels of adjacent pixels and the third sub-pixels of adjacent pixels constitute a plurality of sub-pixel groups;
   a first bank layer dividing the plurality of sub-pixel groups and dividing the first, second and third sub-pixels, the first bank layer having a plurality of first openings corresponding to the first, second and third sub-pixels of each of the plurality of sub-pixel group; and
   a second bank layer on the first bank layer, the second bank layer dividing the first, second and third sub-pixels within each pixel of the plurality of pixels, the second bank layer having a plurality of second openings corresponding to the plurality of sub-pixel group.

2. The display device of claim 1, wherein the second bank layer further divides the sub-pixel groups from each other.

3. The display device of claim 1, wherein each of the first sub-pixels of one of the plurality of sub-pixel groups displays a first color, each of the second sub-pixels of one of the plurality of sub-pixel groups displays a second color, and each of the third sub-pixels of one of the plurality of sub-pixel groups displays a third color.

4. The display device of claim 1, wherein each of the plurality of pixels has a hexagonal shape, and at least one of the first, second and third sub-pixels is disposed at a vertex of the hexagonal shape.

5. The display device of claim 4, wherein the plurality of pixels has a honeycomb shape.

6. The display device of claim 5, wherein the first, second and third sub-pixels are disposed at separated three vertexes of the hexagonal shape, respectively, and each of the plurality of sub-pixel groups includes three of the first sub-pixels, three of the second sub-pixels or three of the third sub-pixels.

7. The display device of claim 6, wherein each of the plurality of sub-pixel groups has one of a circular shape and a polygonal shape, and the first bank layer divides the first sub-pixels, the second sub-pixels or the third sub-pixels of each of the plurality of sub-pixel groups with respect to a center of the circular shape.

8. The display device of claim 6, wherein the first sub-pixels, the second sub-pixels or the third sub-pixels of each of the plurality of sub-pixel groups have a same area as each other.

9. The display device of claim 8, wherein the first, second and third sub-pixels display red, green and blue colors, respectively.

10. The display device of claim 4, wherein the second bank layer exposes edge portions of the first bank layer.

11. The display device of claim 10, wherein the first bank layer includes a hydrophilic material and the second bank layer includes a hydrophobic material.

12. The display device of claim 4, further comprising a gate line and a data line crossing each other,
    wherein at least one of the first, second and third sub-pixels is connected to the gate line and the data line, and
    wherein the gate line and the data line are disposed along sides of each of the plurality of pixels to have a zigzag shape.

13. The display device of claim 12, wherein the gate line is bent with an angle of 120° to have the zigzag shape including a straight line and a triangular protrusion, and
    wherein the data line is bent with an angle of 120° to have the zigzag shape including a straight line and a trapezoidal protrusion.

14. The display device of claim 4, further comprising first, second and third emitting layers on the first bank layer in the first, second and third sub-pixels, respectively,
    wherein the first emitting layers, the second emitting layers or the third emitting layers of each of the plurality of sub-pixel groups are connected to each other, and
    wherein preferably the first, second and third emitting layers are formed through a soluble process including an inkjet printing method and a nozzle printing method.

15. The display device of claim 1, wherein at least some of the pixels are respectively connected to exactly two gate lines and to exactly two data lines.

\* \* \* \* \*